United States Patent
Huisman et al.

(10) Patent No.: US 7,313,744 B2
(45) Date of Patent: Dec. 25, 2007

(54) METHODS AND APPARATUS FOR TESTING A SCAN CHAIN TO ISOLATE DEFECTS

(75) Inventors: Leendert M. Huisman, South Burlington, VT (US); William V. Huott, Holmes, NY (US); Maroun Kassab, St-Eustache (CA); Franco Motika, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 458 days.

(21) Appl. No.: 10/708,380

(22) Filed: Feb. 27, 2004

(65) Prior Publication Data

US 2005/0193297 A1  Sep. 1, 2005

(51) Int. Cl.
*G01R 31/28* (2006.01)

(52) U.S. Cl. .............. 714/726; 714/8; 714/30; 714/738; 326/16; 324/73

(58) Field of Classification Search ........ 714/724–726, 714/738; 324/73; 326/16
See application file for complete search history.

(56) References Cited

U.S. PATENT DOCUMENTS

| | | | |
|---|---|---|---|
| 3,761,695 A | | 9/1973 | Eichelberger |
| 4,945,536 A | * | 7/1990 | Hancu ................... 714/727 |
| 5,032,783 A | * | 7/1991 | Hwang et al. ............ 324/73.1 |
| 5,617,430 A | * | 4/1997 | Angelotti et al. ........... 714/726 |
| 5,784,382 A | * | 7/1998 | Byers et al. ................ 714/726 |
| 6,223,312 B1 | * | 4/2001 | Nozuyama .................. 714/724 |
| 6,308,290 B1 | | 10/2001 | Forlenza et al. |
| 6,490,702 B1 | | 12/2002 | Song et al. |
| 6,516,432 B1 | | 2/2003 | Motika et al. |
| 6,622,273 B1 | * | 9/2003 | Barnes ....................... 714/733 |

OTHER PUBLICATIONS

E.B. Eichelberger, et al, "A Logic Design Structure for LSI Testability", Proceedings of the Fourteenth Design Automation Conference, New Orleans, 1977, pp. 462-468.

David P. Vallett, "IC Failure Analysis: The Importance of Test and Diagnostics", IEEE Design & Test of Computers, Jul.-Sep. 1997, pp. 76-82.

(Continued)

Primary Examiner—Guy Lamarre
Assistant Examiner—Esaw T. Abraham
(74) Attorney, Agent, or Firm—Michael LeStrange; Dugan & Dugan PC

(57) ABSTRACT

Systems, methods and apparatus are provided for isolating a defect in a scan chain. The invention includes modifying a first test mode of a plurality of latches included in a scan chain, operating the latches in the modified first test mode, and operating the plurality of latches included in the scan chain in a second test mode. A portion of the scan chain adjacent and following a stuck-@-0 or stuck-@-1 fault in the scan chain may store and/or output a value complementary to the value on the output of the previous portion of the scan chain due to the fault. Such values may be unloaded from the scan chain and used for diagnosing (e.g., isolating a defect in) the defective scan chain. Numerous other aspects are provided.

30 Claims, 13 Drawing Sheets

OTHER PUBLICATIONS

James L. Schafer et al. "Partner SRLS for Improved Shift Register Diagnostics", IEEE VLSI Test Symposium, Jun. 1992, pp. 198-200.

Sandip Jundu, "Diagnosing Scan Chain Faults", IEEE Transactions On Very Large Scale Integration (VLSI) Systems, vol. 2, No. 4, Dec. 1994, pp. 512-517.

Samantha Edirisooriya et al., "Diagnosis of Scan Path Failures", Proceedings of IEEE VLSI Test Symposium Apr. 1995, pp. 250-255.

Sridhar Narayanan et al., "An Efficient Scheme to Diagnose Scan Chains", International Test Conference, Jul. 1997, pp. 704-713.

* cited by examiner

METHODS AND APPARATUS FOR TESTING A SCAN CHAIN TO ISOLATE DEFECTS

BACKGROUND OF INVENTION

1. Field of the Invention

The present invention relates generally to integrated circuits, and more particularly to methods and apparatus for defect isolation within integrated circuits.

2. Background

A circuit design may include a plurality of latches, such as shift register latches (SRLs), catenated to form a level sensitive scan design (LSSD) scan chain. If a circuit design is determined to be defective, existing test methods (e.g., scan based design methodologies) may be used for testing and diagnosing the circuit design. More specifically, the scan based design test methodologies may be used to identify a faulty latch (e.g., SRL) included in a LSSD scan chain. However, when the LSSD scan chain is defective and access to the internal logic of the circuit design is greatly reduced, rapid and accurate diagnosis of the fault or defect using such test methodologies is inhibited.

Existing test methodologies are not precise and/or foolproof. For example, software fault simulation techniques may be used to try to isolate a failing latch in a LSSD scan chain. However, such techniques consume processing time and may not be used when all LSSD scan chains included in the circuit design are broken (e.g., faulty). Further, software fault simulation techniques may often point to a set of possible faulty candidates (e.g., more than one latch included in the LSSD scan chain) rather than a single faulty latch.

Another method of testing and diagnosing (e.g., isolating a defect in) defective LSSD scan chains in a circuit design may include a noise injection or insertion technique. The noise injection or insertion technique involves partially powering-down, then powering-up the circuit design and scanning out data hoping that the latch after the fault in the circuit design will include the opposite value of the fault. However latches are usually asymmetrical, and therefore, tend to receive the same logic state after a power-down and subsequent power-up. Alternatively, external latch disturb techniques (e.g., using a laser, etc.) may be employed to test and diagnose LSSD scan chains. However, these external techniques are more suitable for Physical Failure Analysis (PFA).

Another method of testing and diagnosing (e.g., isolating a defect in) defective LSSD scan chains in a circuit design may include a lateral insertion technique, in which the broadside (e.g., data) port of one or more latches included in a LSSD scan chain are used to input (e.g., load) data to the one or more latches. Thereafter, the values may be unloaded for diagnosing the faulty LSSD scan chain. However, such a method requires excessive test generation. For example, data may be inputted to one or more latches included in the faulty LSSD scan chain via the broadside port of the one or more latches, and thereafter, scanned out of the LSSD scan chain until a faulty latch is found. The lateral insertion technique is not always feasible or successful.

By improving the diagnostic time for isolating a failing latch in a LSSD scan chain of the circuit design, improvements may be made quickly to the manufacturing yield of the circuit design, thereby ensuring successful and timely production of the circuit design. Therefore methods and apparatus for testing and diagnosing (e.g., isolating a defect in) a LSSD scan chain are desired.

SUMMARY OF INVENTION

In a first aspect of the invention, a first method is provided for isolating a defect in a scan chain. The first method includes the steps of (1) modifying a first test mode (e.g., "flush" test mode) of one or more of a plurality of latches included in the scan chain; (2) operating the one or more latches whose first test modes are modified in the modified first test mode; and (3) operating one or more of the plurality of latches included in the scan chain in a second test mode (e.g., "scan" test mode).

In a second aspect of the invention, a second method is provided for isolating a defect in a scan chain. The second method includes the steps of (1) modifying a first test mode of one or more of a plurality of latches included in the scan chain; (2) while inputting a first value to the scan chain, operating the one or more latches whose first test modes are modified in the modified first test mode to store a first set of data in the scan chain; (3) operating one or more of the plurality of latches included in the scan chain in a second test mode to output the first set of data; (4) while inputting a second value to the scan chain, operating the one or more latches whose first test modes are modified in the modified first test mode to store a second set of data in the scan chain; (5) operating one or more of the plurality of latches included in the scan chain in the second test mode to output the second set of data; and (6) employing the first set of data and the second set of data to isolate a defect in the scan chain.

In a third aspect of the invention, a third method is provided for testing and diagnosing a scan chain. The third method includes the steps of (1) altering the function of the scan chain flush test mode; and (2) employing the flush test mode to test and diagnose the scan chain. Numerous other aspects are provided, as are apparatus in accordance with these other aspects of the invention.

Other features and aspects of the present invention will become more fully apparent from the following detailed description, the appended claims and the accompanying drawings.

DETAILED DESCRIPTION

Figure 1:
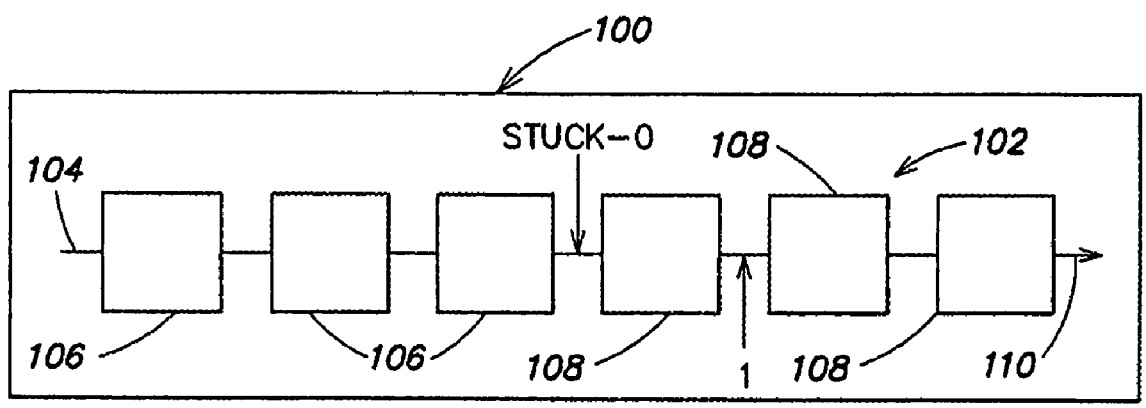
FIG. 1 is a block diagram of an exemplary LSSD scan chain, which may be included in a circuit design, in accordance with an embodiment of the present invention.

FIG. 1 is a block diagram of an exemplary scan chain (e.g., a level sensitive scan design (LSSD) scan chain), which may be included in a circuit design 100, in accordance with an embodiment of the present invention. An LSSD scan chain 102 included in the circuit design 100 may include an input 104, a plurality of portions 106, 108 and an output 110. A portion 106, 108 may include one or more latches (not shown), one or more macros (not shown) or one or more partitions (not shown) of a macro. A latch (e.g., latch circuit) may include an L1 latch included in a master/slave latch, an L2 latch included in the master/slave latch or the master/slave latch itself. A macro may be circuitry adapted to perform a sub-function of the overall function of the circuit design 100. Each macro and/or partition of a macro may include one or more latches (e.g., latch circuit) modified in accordance with the present invention.

As stated, during production of a circuit design 100, one or more scan chains (e.g., LSSD scan chains 102) included in the circuit design 100 may be defective. For example, a LSSD scan chain 102 included in the circuit design 100 may exhibit a defect, such as a DC defect. LSSD scan chains 102 may exhibit other types of defects. A DC defect may include a stuck-@-0 fault or defect or a stuck-@-1 fault or defect. A stuck-@-0 fault may cause the output of a portion 106, 108 of the LSSD scan chain to be of a low logic state (e.g., 0) regardless of a value stored by the portion 106, 108 (e.g., by a latch included in the portion 106, 108) of the LSSD scan chain 102. Similarly, a stuck-@-1 fault causes the output of a portion 106, 108 of the LSSD scan chain 102 to be of a high logic state (e.g., 1) regardless of a value stored in the portion 106, 108 (e.g., by a latch included in the portion 106, 108) of the LSSD scan chain 102.

Using the methods and apparatus of the present invention, a portion 106, 108 adjacent and following a stuck-@-0 or stuck-@-1 fault in a LSSD scan chain 102 may store and/or output a value complementary to the value on the output of the previous portion of the LSSD scan chain 102 due to the fault (e.g., DC defect). Such values may be unloaded from the LSSD scan chain 102 and used for diagnosing (e.g., isolating a defect in) the defective LSSD scan chain 102. For example, if a stuck-@-0 fault causes the output of a portion 106 to be of a low logic state (e.g., 0), according the present methods and apparatus, the output of a portion 108 adjacent and following the stuck-@-0 fault will be complementary to the output of the previous portion 106. Therefore, the value stored and/or outputted by the portion 108 adjacent and following the stuck-@-0 fault is of a high logic state (e.g., 1). The values stored by each portion 106, 108 of the LSSD scan chain may be unloaded for diagnosing the defective LSSD scan chain 102.

Figure 2:
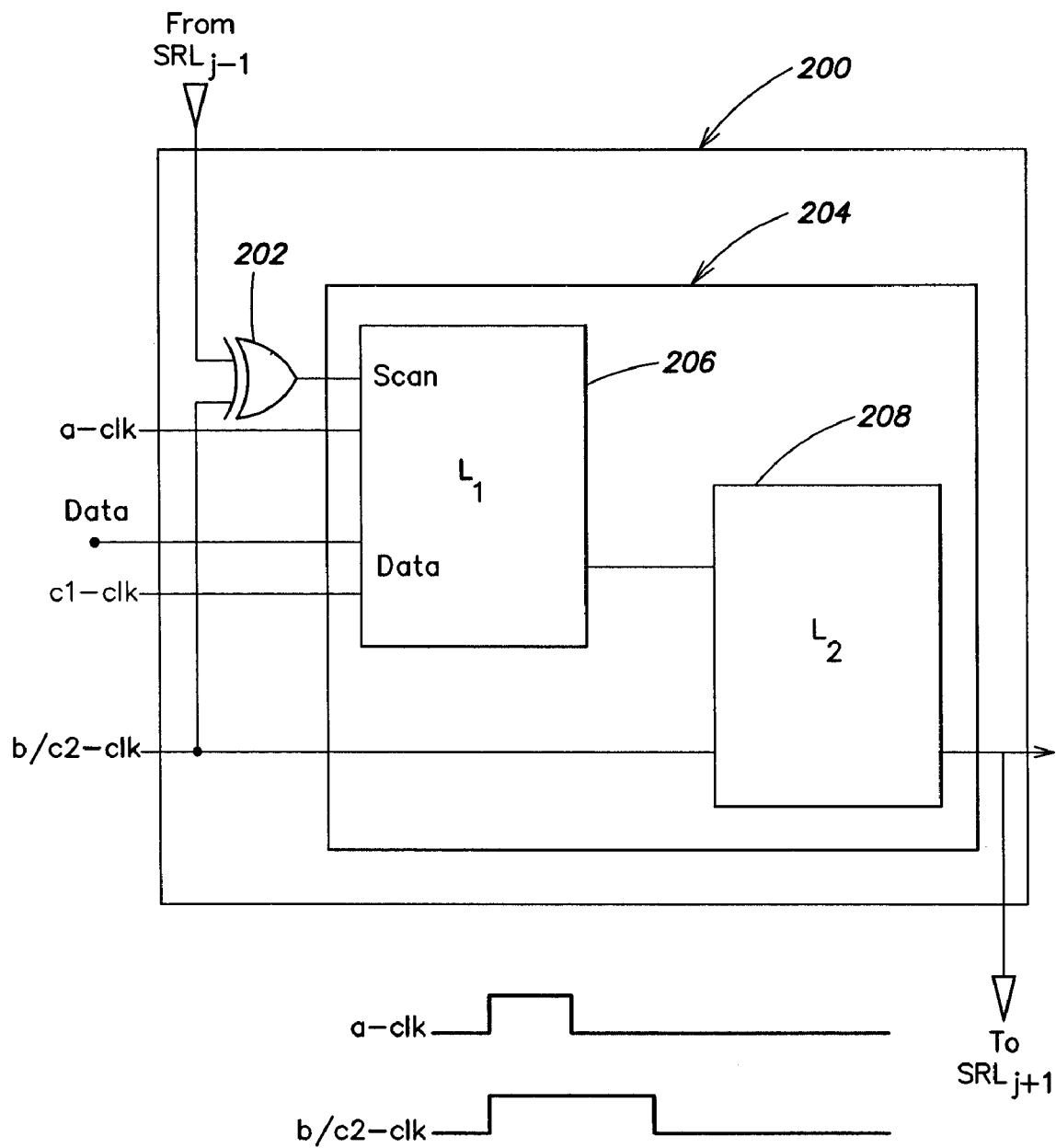
FIG. 2 is a block diagram of a first exemplary latch circuit included in one or more portions of the LSSD scan chain in accordance with an embodiment of the present invention.

FIG. 2 is a block diagram of a first exemplary latch circuit 200 included in one or more portions 106, 108 of the LSSD scan chain in accordance with an embodiment of the present invention. The first exemplary latch circuit 200 (e.g., a shift register latch (SRL)) may include a logic device, such as an exclusive-OR (XOR) gate 202, coupled to a master/slave latch 204, which includes an L1 latch 206 coupled to an L2 latch 208. More specifically, the XOR gate 202 may receive a first input from a previous portion 106, 108 (e.g., an output of a previous first exemplary latch circuit 200) included in the LSSD scan chain 102. The XOR gate 202 may receive a second input (e.g., clock signal b/c2-clk), which may be the clock signal inputted to the L2 latch 208. The output of the XOR gate 202 may be coupled to the scan input of the L1 latch 206. The output of the L2 latch 208 serves as the output of the first exemplary latch circuit 200. The output of the first exemplary latch circuit 200 may be coupled to a portion (e.g., another first exemplary latch circuit 200) adjacent and following the first exemplary latch circuit 200 in the LSSD scan chain 102. Although in the above embodiment, the XOR gate 202 is integrated with the first exemplary latch circuit 200, in other embodiments, the XOR gate 202 may be coupled to the first exemplary latch circuit 200 (e.g., as an external device).

Similar to a conventional master/slave latch, the L1 latch 206 may receive data input from a data port. The L1 latch 206 may be coupled to a first clock signal, a-clk, for capturing data in the L1 latch 206 while operating in a test or scan mode, and a second clock signal, c1-clk for capturing data in the L1 latch 206 while operating in a functional mode. The L2 latch 208 may be coupled to the clock signal, b/c2-clk, which is coupled to the XOR gate 202. The b/c2-clk signal may be used for loading data into the L2 latch and launching data from the L2 latch 208 to an output of the first exemplary latch circuit 200.

The first exemplary latch circuit 200 may be operated in at least one of a functional mode, a first test mode and a second test mode. Assuming c1-clk and b/c2-clk are non-overlapping in the functional mode, data provided to the first exemplary latch circuit 200 via a data port is captured by the L1 latch 206 when c1-clk is asserted. Data is launched from the L2 latch 208 when b/c2-clk is asserted. In one or more embodiments, a clock signal may be asserted when the clock signal is of a high logic state. In other embodiments, a clock signal may be asserted when the clock signal is of a low logic state. The first test mode of a conventional master/slave latch may be a flush test mode in which the same values may be propagated through each latch in a LSSD scan chain. In contrast, during the first test mode (e.g., modified flush test mode (Ripple Flush)) of the first exemplary latch circuit 200, data received by the first exemplary latch circuit 200 from a previous adjacent portion 106, 108 of the LSSD scan chain 102 may be inverted and stored in the first exemplary latch circuit 200. The first exemplary latch circuit 200 operates in the first test mode (e.g., modified flush test mode) when both a-clk and b/c2-clk are asserted at the same time.

In the second test mode (e.g., a scan mode), data received by the first exemplary latch circuit 200 from a previous adjacent portion 106, 108 of the LSSD scan chain 102 via a scan port may be stored in the first exemplary latch circuit 200. Assuming a-clk and b/c2-clk are non-overlapping, in the second test mode (e.g., scan mode) when a-clk is asserted data (e.g., input data from an adjacent and previous portion 106, 108 of the LSSD scan chain 102) may be stored in the L1 latch 206. Because b/c2-clk is not asserted to load data into the L1 latch 206 during the second test mode, the XOR gate 202 does not invert the input data. When b/c2-clk is asserted, the data may be launched from the L2 latch 208 (e.g., to an adjacent and following portion 106, 108 of the LSSD scan chain 102).

Figure 3:
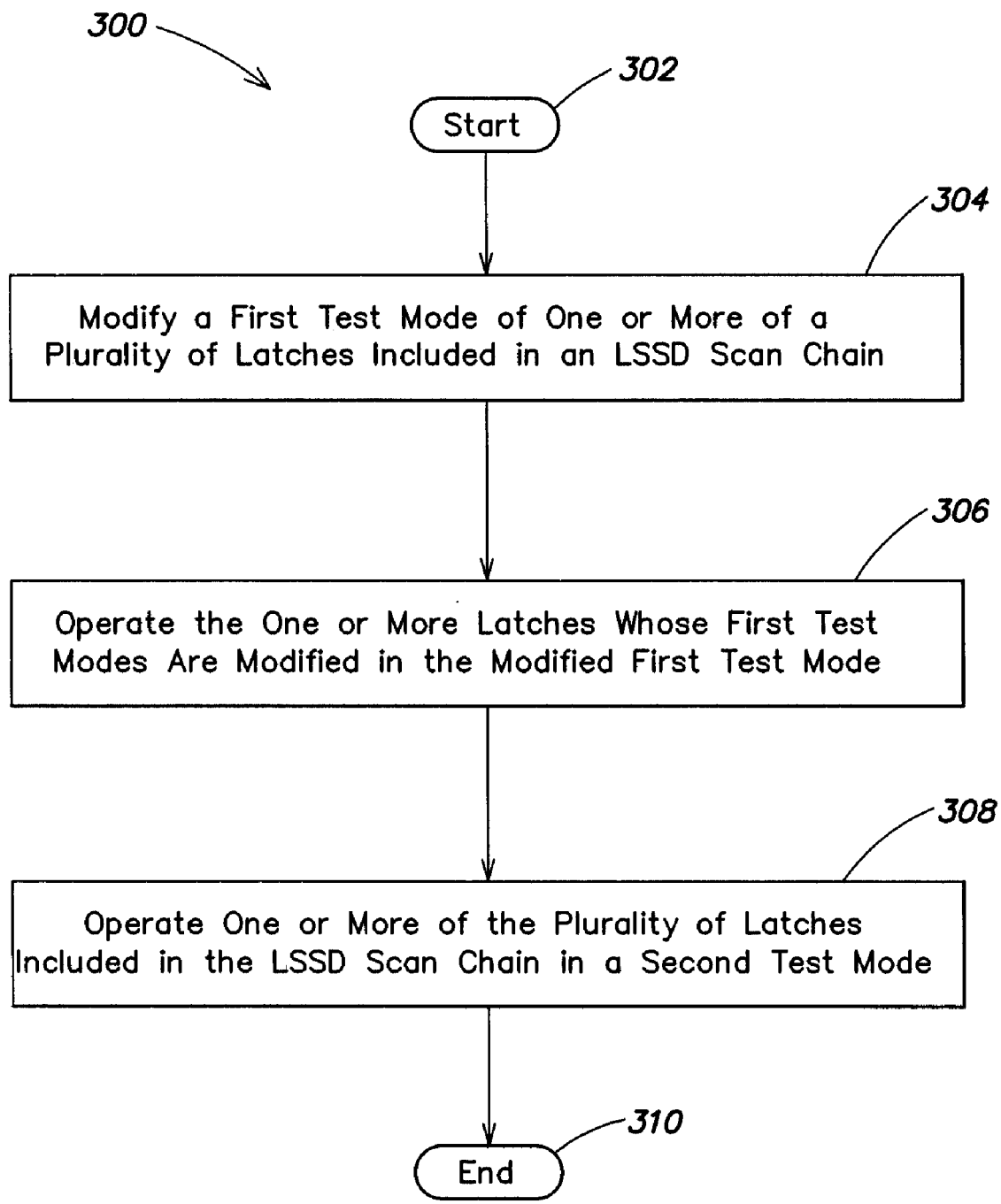
FIG. 3 illustrates an exemplary method of isolating a defect in a LSSD scan chain in accordance with an embodiment of the present invention.

The operation of the integrated circuit (IC) on which a method of testing and/or diagnosing (e.g., isolating a defect in) a scan chain (e.g., LSSD scan chain 102) may be performed is now described with reference to FIGS. 1-2, and with reference to FIG. 3 which illustrates an exemplary method of isolating a defect in a LSSD scan chain 102. With reference to FIG. 3, in step 302, the method 300 begins. In step 304, a first test mode of one or more of a plurality of latches included in the LSSD scan chain may be modified. When a conventional master/slave latch included in a LSSD scan chain is operated in a first test mode (e.g., when both a-clk and b/c2-clk are asserted) data received from a previous adjacent portion (e.g., master/slave latch) in the LSSD scan chain is stored in and launched from the conventional master/slave latch. In this manner, data (e.g., the same value) may be stored in and propagated through one or more latches included in the LSSD scan chain. In contrast, the first test mode of the latch 204 included in the first exemplary latch circuit 200 of the present invention is modified by a logic device, such as an XOR gate 202. More specifically, to operate in the first test mode, both a-clk and b/c2-clk coupled to the first exemplary latch circuit 200 are asserted (e.g., both a-clk and b/c2-clk are of a high logic state). Alternatively, other combinations of clock polarities may be employed. Because b/c2-clk input by the XOR gate 202 is asserted, the XOR gate 202 serves as an inverter while the first exemplary latch circuit 200 operates in the first test mode. Therefore, the data inputted by the XOR gate 202 from a previous adjacent portion 106, 108 (e.g., a previous adjacent first exemplary latch circuit 200, such as $SRL_{j-1}$) of the LSSD scan chain 102 is inverted, then stored in the L1 latch 206 and launched out of the L2 latch 208, and therefore, launched out of the first exemplary latch circuit 200 to the next portion 106, 108 (e.g., a following adjacent first exemplary latch circuit 200, such as $SRL_{j+1}$) of the LSSD scan chain 102. Therefore, by coupling an XOR gate 202 to the scan input of L1 latch 206 of a master/slave latch 204 for one or more of a plurality of master/slave latches 204 included in a LSSD scan chain to form one or more first exemplary latch circuits 200, a first test mode of one or more of a plurality of latches included in the LSSD scan chain is modified. More specifically, the first test mode (e.g., flush test mode) is modified such that adjacent portions of a non-defective section of the LSSD scan chain 102 may store complementary signals when the one or more of the plurality of latches included in the LSSD scan chain 102 are operated in the modified first test mode. Thereafter, step 306 may be performed.

In step 306, one or more latches whose first test modes are modified are operated in the modified first test mode (e.g., modified flush mode). More specifically both a-clk and b/c2-clk will be asserted for a period of time to allow the LSSD scan chain 102 to be initialized. During initialization, data may be stored in each of the first exemplary latch circuits 200 (e.g., latches 204 included in the first exemplary latch circuits 200). For example, if a LSSD scan chain 102 includes a plurality of catenated first exemplary latch circuits 200, operating the one or more latches (e.g., latches included in the first exemplary latch circuits 200) whose first test modes are modified may include initializing the value stored in the one or more latches whose first test mode are modified such that adjacent portions 106, 108 (e.g., first exemplary latch circuits 200) of a non-defective section of the LSSD scan chain store complementary signals. Therefore, an alternating set of complementary values may be propagated through and stored in the LSSD scan chain 102. Once the LSSD scan chain 102 is initialized, a-clk may be disasserted (e.g., turned off) before b/c2-clk. In this manner, the latch (e.g., first exemplary latch circuit 200) after the defect may store a value opposite the value caused by the defect. Exemplary values stored in a LSSD scan chain 102 while operating one or more latches (e.g., first exemplary latch circuits 200) whose first test modes are modified in the modified first test mode are described with reference to FIG. 4. Further, output responses (e.g., of the LSSD scan chain) may be analyzed and compared to expected results. An equivalent of a conventional "flush delay" test, which determines the total delay of the latches in a scan chain, may still be performed. Thereafter, step 308 is performed.

In step 308, one or more of the plurality of latches included in the LSSD scan chain 102 may be operated in a second test mode. The second test mode may be a scan mode. As stated above, while operating in the second test mode (e.g., scan mode), a-clk and b/c2-clk may be non-overlapping. More specifically, when a-clk is asserted, b/c2-clk is not asserted and vice versa. Therefore, when a-clk (connected to a first exemplary latch circuit 200) is asserted, the XOR gate 202 included in the first exemplary latch circuit 200 receives input from a previous portion 106, 108 of the LSSD scan chain and from b/c2-clk, which is not asserted (e.g., is of a low logic state). Because b/c2-clk is a low logic state, the XOR gate 202 is non-inverting. Consequently, when a-clk is asserted, the L1 latch 206 captures the data (e.g., the data received from the previous adjacent portion 106, 108) inputted by the XOR gate 202. Thereafter, when b/c2-clk is asserted, the data is launched from the L2 latch 208, and therefore, outputted from the first exemplary latch circuit 200. In this manner, data may be loaded into the LSSD scan chain 102 and/or unloaded from the LSSD scan chain 102 while one or more of the plurality of latches in the LSSD scan chain 102 (e.g., latches included in first exemplary latch circuit 200) are operated in the second test mode (e.g., scan mode). For example, as new data is stored in the LSSD scan chain 102, data previously stored in the LSSD scan chain 102 may be propagated through and/or outputted by the LSSD scan chain 102. By observing the signals at the output 110 of the LSSD scan chain 102 while operating one or more of the plurality of latches included in the LSSD scan chain 102 in the second test mode (e.g., scan mode), the data stored may be viewed as it is unloaded from the LSSD scan chain 102. Further, output responses (e.g., of the LSSD scan chain) may be analyzed and compared to expected results.

Thereafter, step 310 may be performed. In step 310, the method 300 ends.

Through the use of the method 300 of FIG. 3, a defect in a scan chain (e.g., a LSSD scan chain 102) may be isolated (e.g., to a failing latch or an associated scan clock tree). The present methods and apparatus avoid the disadvantages of the prior art (described above) and allow a user to quickly determine the exact position of a failing latch in a LSSD scan chain and modify a circuit design which includes the LSSD scan chain accordingly, if necessary. A circuit modification is necessary to overcome a defect in a scan chain resulting from a design error. However, generally, a defect is introduced in the scan chain due to a process problem. For example, the first test mode (e.g., flush test mode) of one or more of a plurality of latches included in a LSSD scan chain 102 may be modified by coupling the one or more latches to logic devices, such as XOR gates 202, respectively. The one or more latches whose first test modes are modified may be operated in the modified flush test mode such that an alternating set of complementary values are stored in adjacent portions (e.g., latches) 106, 108 included in the LSSD scan chain 102. Thereafter, one or more of the plurality of latches included in the LSSD scan chain 102 may be operated in the second test mode.

For example, data of a low logic state (e.g., 0) may be provided to the input 104 of the LSSD scan chain 102 while the LSSD scan chain 102 (e.g., one or more latches included in the LSSD scan chain 102 whose first test mode is modified) operates in the modified first test mode to initialize the LSSD scan chain 102. Such a method may be termed a Ripple Flush "0". Thereafter, one or more of the plurality of latches included in the LSSD scan chain 102 may be operated in the second test mode (e.g., scan mode) to unload (and observe) the data stored in the LSSD scan chain 102 while operating in the modified first test mode.

Similarly, data of a high logic state (e.g., 1) may be provided to the input of the LSSD scan chain 102 while the LSSD scan chain 102 (e.g., one or more latches included in the LSSD scan chain 102 whose first test modes are modified) operates in the modified first test mode to initialize the LSSD scan chain 102. Such a method may be termed a Ripple Flush "1". Thereafter, one or more of the plurality of latches included in the LSSD scan chain 102 may be operated in the second test mode. By employing (e.g., comparing) the data unloaded from the LSSD scan chain 102 after a Ripple Flush "0" with the data unloaded from the LSSD scan chain 102 after a Ripple Flush "1", a defect in the LSSD scan chain 102 may be isolated. More specifically, by observing the cycle on which the scan chain output switches for both a Ripple Flush "0" (e.g., a true flush initialization sequence) and a Ripple Flush "1" (e.g., a complement flush initialization sequence), the failing LSSD scan chain 102 (e.g., location of the failing latch) may be diagnosed. The number of latches (e.g., latch circuits) included in the LSSD scan chain 102 and the location of the logic transitions during a Ripple Flush "0" and a Ripple Flush "1" may be used to identify (e.g., pinpoint) the failing latch (e.g., exemplary latch circuit 200). Therefore, a knowledge of the scan chain configuration may be used to determine the failing latch nearest the output of a scan chain. Special patterns (e.g., data patterns) and offline diagnostic processing are not necessary.

By modifying a first test mode of one or more of a plurality of latches included in a LSSD scan chain, the function of the LSSD scan chain flush test mode may be altered. The flush test mode may be employed to test and diagnose the LSSD scan chain. The scan mode may be employed to test and diagnose the LSSD scan chain. In the manner described above, the function of the LSSD scan chain flush test mode may be altered such that an alternating set of complementing states are propagated through the LSSD scan chain. More specifically, the function of the LSSD scan chain flush test mode may be altered by altering the LSSD scan chain path input to one or more latches included in the LSSD scan chain such that the one or more latches write the scan input when the flush test mode is employed.

Figure 4:
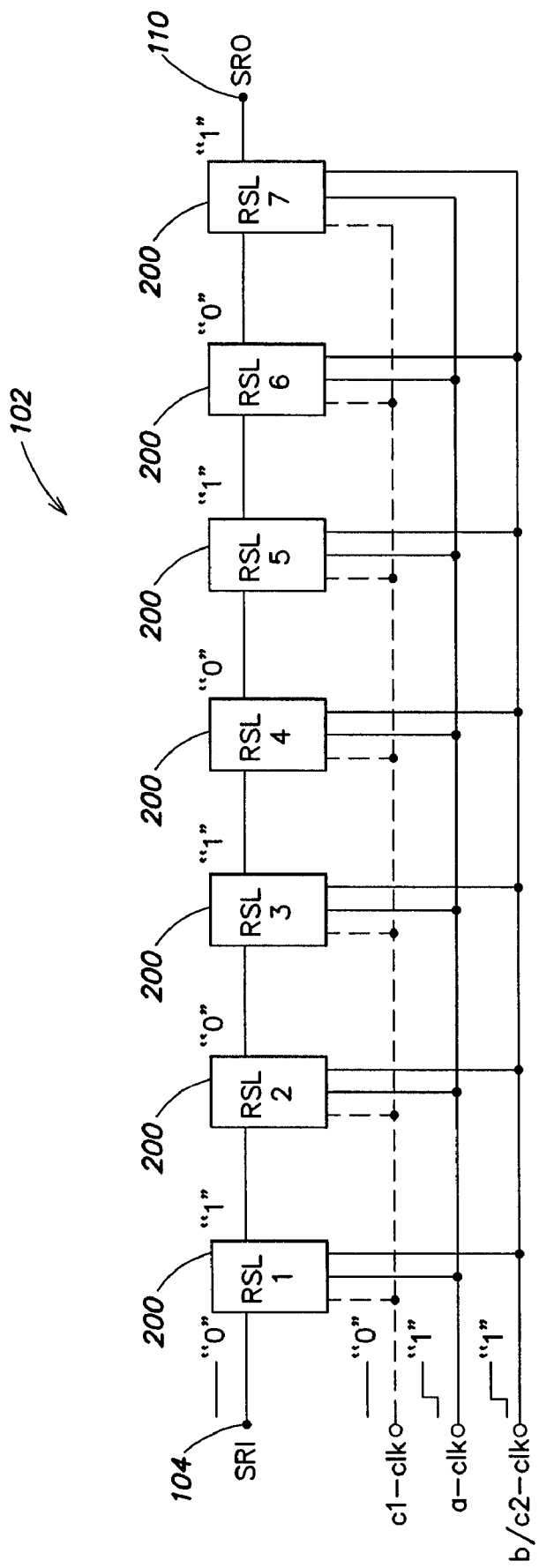
FIG. 4 illustrates values stored in an exemplary LSSD scan chain when a signal of a low logic state is asserted at the input of the LSSD scan chain while the LSSD scan chain is operating in the modified first test mode in accordance with an embodiment of the present invention.

FIG. 4 illustrates values stored in an exemplary scan chain (e.g., LSSD scan chain 102) when a signal of a low logic state is asserted at the input of the LSSD scan chain 102 while the LSSD scan chain 102 is operating in the modified first test mode (e.g., modified flush test mode). The exemplary LSSD scan chain 102 may include latches modified in accordance with the present invention to form one or more first exemplary latch circuit 200 (e.g., SRLs). For example, seven first exemplary latch circuits 200 may be catenated to form a LSSD scan chain 102. Scan chains may include other numbers of latches (e.g., latch circuits). When a low signal is provided to the input 104 of the LSSD scan chain 102 while the LSSD scan chain 102 is operating in the modified first test mode (e.g., modified flush test mode), the signal stored and outputted by the first SRL Relative Stim latch (RSL) 1 included in the LSSD scan chain 102 may be the complement of the signal inputted to the LSSD scan chain 102. The signal stored and outputted by the second SRL RSL2 included in the LSSD scan chain 102 may be the complement of the signal stored and outputted by the first SRL RSL1. Data may be stored and outputted by each of the remaining SRLs RSL3-RSL7 included in the LSSD scan chain 102 in a similar manner. For example, assuming the LSSD scan chain 102 is non-defective, the values stored in and outputted by RSL7-RSL1 are 1, 0, 1, 0, 1, 0 and 1, respectively. The values stored in the LSSD scan chain 102 while operating in the modified first test mode may be unloaded and observed (e.g., by observing the signals on the output 110 of the LSSD scan chain 102) while operating the LSSD scan chain 102 in a second test mode (e.g., a scan mode).

Figure 5:
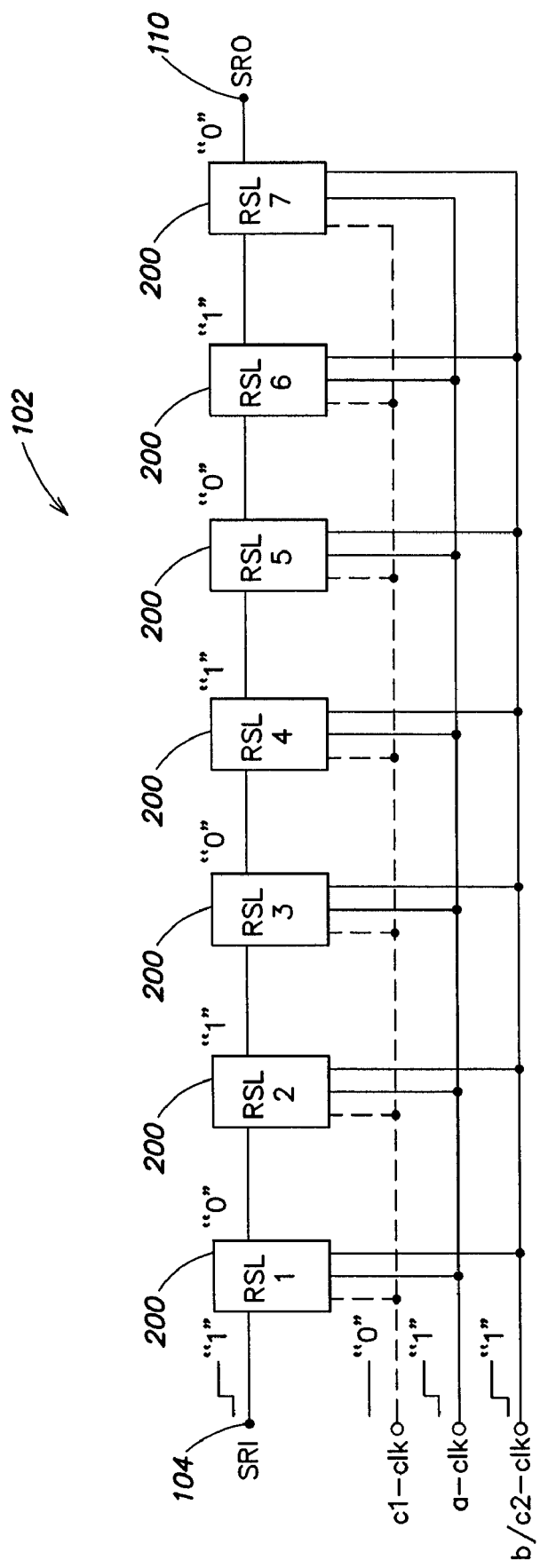
FIG. 5 illustrates values stored in the exemplary scan chain of FIG. 4 when a signal of a high logic state is asserted at the input of the LSSD scan chain while the LSSD scan chain is operating in the modified first test mode in accordance with an embodiment of the present invention.

FIG. 5 illustrates values stored in the exemplary scan chain (e.g., LSSD scan chain 102) of FIG. 4 when a signal of a high logic state is asserted at the input 104 of the LSSD scan chain 102 while the LSSD scan chain 102 is operating in the modified first test mode (e.g., modified flush test mode). When a signal of a high logic state is provided to the input 104 of the LSSD scan chain 102 while the LSSD scan chain 102 is operating in the modified first test mode (e.g., modified flush mode), the signal stored and outputted by the first SRL RSL1 of the LSSD scan chain 102 may be the complement of the signal inputted by the LSSD scan chain 102. Therefore, the signal stored and outputted by SRL RSL1 is of a low logic state (e.g., 0). The signal stored and outputted by the second SRL RSL2 in the LSSD scan chain 102 may be the complement of the signal stored and outputted by the first SRL RSL1. As stated, in a similar manner, data may be stored and outputted by each of the remaining SRLs RSL3-RSL7 of the LSSD scan chain 102. For example, assuming the LSSD scan chain 102 is non-defective, the values stored in and outputted by RSL7-RSL1 are 0, 1, 0, 1, 0, 1 and 0, respectively. The value stored in the LSSD scan chain 102 may be unloaded and observed in the manner described above.

Figure 6:
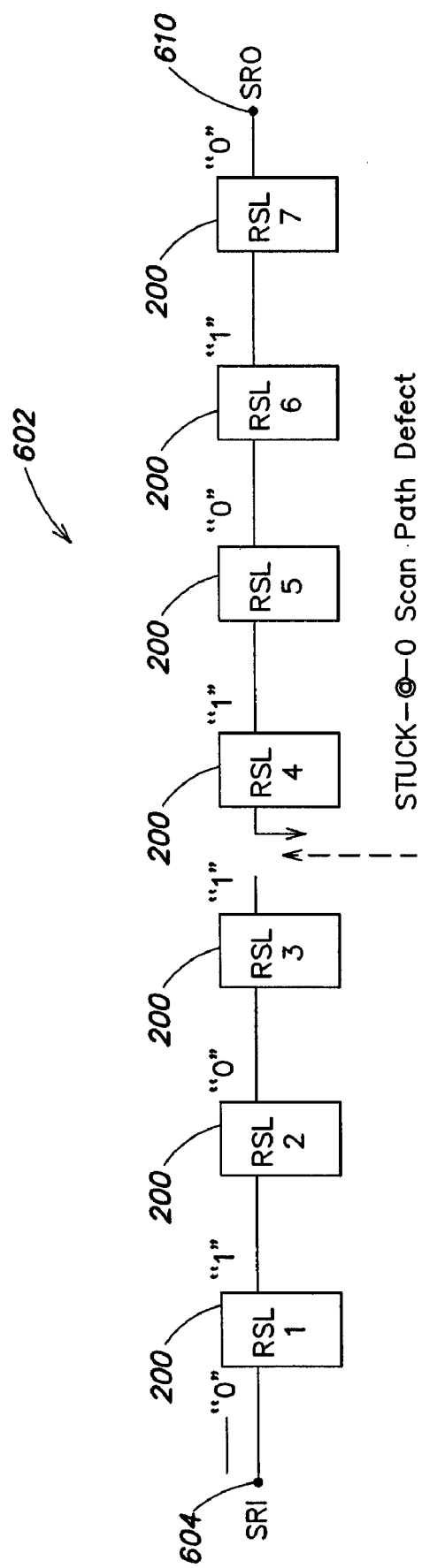
FIG. 6 illustrates first exemplary values stored in a first exemplary defective LSSD scan chain using the method of FIG. 3.

FIG. 6 illustrates first exemplary values stored in a first exemplary defective scan chain (e.g., LSSD scan chain) using the method of FIG. 3. The first exemplary defective LSSD scan chain 602 is similar to the LSSD scan chain 102 of FIG. 4. However, the LSSD scan chain 602 includes a DC defect, such a stuck-@-0 defect. For example, the LSSD scan chain 602 may include a stuck-@-0 defect between the third SRL RSL3 and fourth SRL RSL4.

Because an XOR gate 202 is coupled to a latch included in one or more SRLs 200 of the LSSD scan chain 602, a first test mode of one or more latches (e.g., latches included in the SRLs RSL1-RSL7) included in the LSSD scan chain 602 is modified. One or more latches included in the LSSD scan chain 602 may be operated in the modified first test mode (e.g., modified flush mode). For example, a Ripple Flush "0" may be performed. More specifically, one or more latches included in the LSSD scan chain 602 (e.g., latches whose first test modes are modified), and therefore, the LSSD scan chain 602, may be operated in the modified first test mode while a signal of a low logic state (e.g., 0) is applied to the input 604 of the LSSD scan chain 602. As described above, the values stored in and outputted by the first through third SRLs RSL1-RSL3 are 1, 0 and 1, respectively. In a non-defective LSSD scan chain 102, the output of a previous portion 106, 108 (e.g., SRL 200) of the LSSD scan chain 102 is inputted by an adjacent following portion 106, 108 (e.g., SRL 200) of the LSSD scan chain 602. However, due to the stuck-@-0 defect in the LSSD scan chain 102, a signal of a low logic state (e.g., 0) is inputted to the fourth SRL RSL4 of the LSSD scan chain 602 regardless of the signal outputted by the third SRL RSL3. Because the remaining section of the LSSD scan chain 602 is non-defective, the fourth through seventh SRLs RSL4-RSL7 will operate as described above in FIG. 4. Therefore, the values stored in and outputted by the fourth through seventh SRLs RSL4-RSL7 are 1, 0, 1 and 0, respectively. In this manner, values, such as initial values, may be stored in the defective LSSD scan chain 602 (e.g., the LSSD scan chain 602 may be initialized).

One or more latches included in the LSSD scan chain 602 may be operated in a second test mode. For example, every SRL RSL1-RSL7 included in the LSSD scan chain 602, and therefore LSSD scan chain 602, may be operated in a scan mode. In this manner, data may be unloaded and observed (e.g., by observing the signals provided at the output 610 of the LSSD scan chain 602) from the LSSD scan chain 602. For example, the values (e.g., first seven values) unloaded from the defective LSSD scan chain 602 may be 0, 1, 0, 1, 1, 1 and 1. In contrast, as described with reference to FIG. 4, the values unloaded from a non-defective LSSD scan chain 102 similar to the LSSD scan chain 602 are 1, 0, 1, 0, 1, 0 and 1. Therefore, the values unloaded from the defective LSSD scan chain 602 do not accurately reflect the values stored in SRLs RSL1-RSL7 of the LSSD scan chain 602 nor the values that should be stored in the LSSD scan chain 602 if it is non-defective. As will be described below, the values unloaded from the LSSD scan chain 602 after a Ripple Flush "0" may be used (e.g., in part) to isolate a defect in the LSSD scan chain 602.

Figure 7:
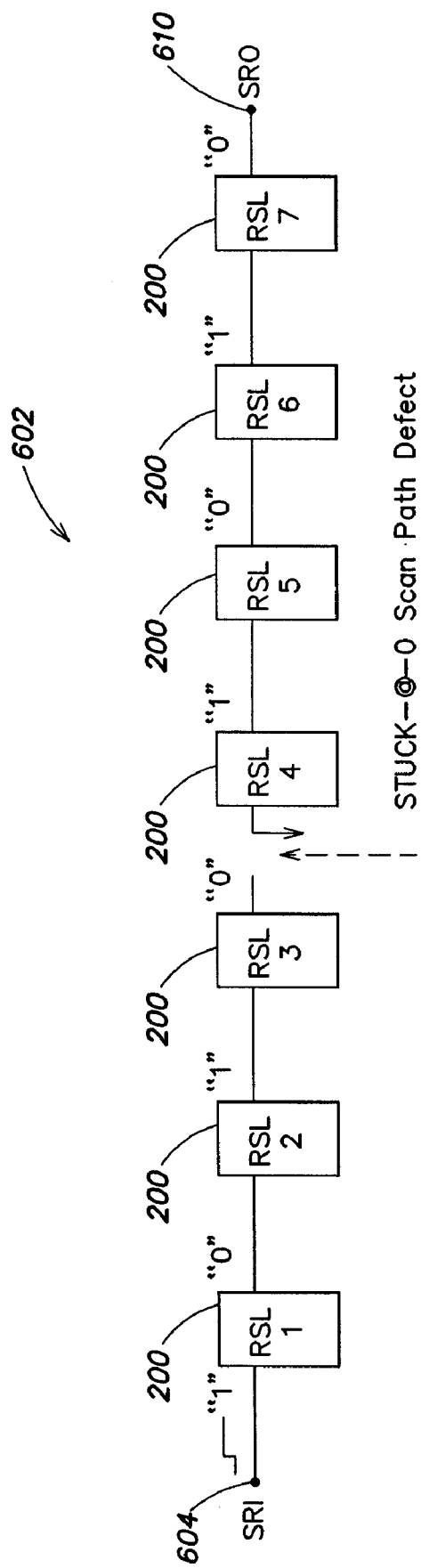
FIG. 7 illustrates second exemplary values stored in the first exemplary defective LSSD scan chain using the method of FIG. 3.

Similarly, FIG. 7 illustrates second exemplary values stored in the first defective LSSD scan chain 602 using the method of FIG. 3. As described above, a first test mode of one or more latches included in the LSSD scan chain 602 may be modified. One or more latches included in the LSSD scan chain 602 may be operated in the modified first test mode (e.g., modified flush test mode). In contrast to the method described with reference to FIG. 6, a Ripple Flush "1" may be performed. More specifically, one or more latches included in the LSSD scan chain 602 (e.g., latches whose first test modes are modified) may be operated in the modified first test mode (e.g., modified flush test mode) while a signal of a high logic state (e.g., 1) is applied to the input 604 of the LSSD scan chain 602. As described above, the value stored in and outputted by the first through third SRLs RSL1-RSL3 are 0, 1 and 0, respectively. Due to the stuck-@-0 defect, a signal of a low logic state (e.g., 0) is always inputted to the fourth SRL RSL4 regardless of the signal outputted by the third SRL RSL3. Because the remaining section of the LSSD scan chain 602 is non-defective, the values stored in and outputted by the fourth through seventh SRLs RSL4-RSL7 are 1, 0, 1 and 0, respectively. In this manner, the defective LSSD scan chain 602 may be initialized.

As described above, one or more latches included in the LSSD scan chain 602 may be operated in a second test mode (e.g., scan mode). For example, every SRL RSL1-RSL7 may be operated in the scan mode to unload and observe data from the LSSD scan chain 602. In this example, the values (e.g., first seven values) unloaded from the defective LSSD scan chain 602 may be 0, 1, 0, 1, 1, 1 and 1. In contrast, as described with reference to FIG. 5, the values unloaded from a non-defective LSSD scan chain 102 similar to the LSSD scan chain 602 after a Ripple Flush "1" are 0, 1, 0, 1, 0, 1 and 0. Therefore, the values unloaded from the defective LSSD scan chain 602 do not accurately reflect the values stored in SRLs RSL1-RSL7 of the LSSD scan chain 602 nor the values that should be stored in the LSSD scan chain 602 if it is non-defective.

By employing (e.g., comparing) the values unloaded from the defective LSSD scan chain 602 after a Ripple Flush "0" (e.g., 0, 1, 0, 1, 1, 1 and 1) and a Ripple Flush "1" (e.g., 0, 1, 0, 1, 1, 1 and 1), and comparing them to corresponding values from a "good machine" (e.g., a non-defective LSSD scan chain) for a Ripple Flush "0" (e.g., 1, 0, 1, 0, 1, 0 and 1) and a Ripple Flush "1" (e.g., 0, 1, 0, 1, 0, 1 and 0), a designer may isolate a defect (e.g., a defect closest to the LSSD scan chain 602 output) in the LSSD scan chain 602.

Figure 8:
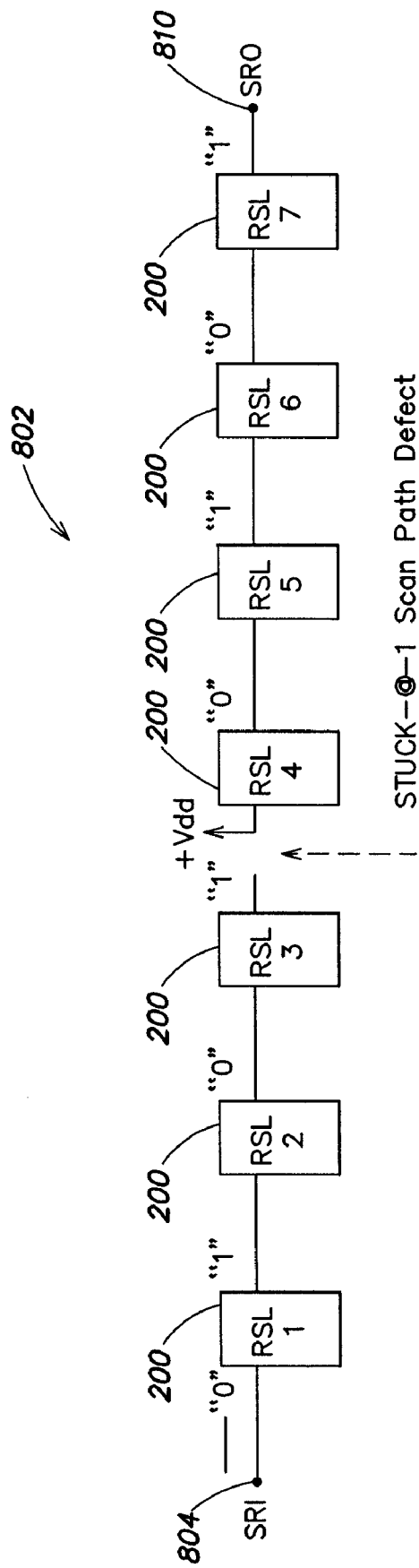
FIG. 8 illustrates first exemplary values stored in a second exemplary defective LSSD scan chain using the method of FIG. 3.

FIG. 8 illustrates first exemplary values stored in a second exemplary defective scan chain (e.g., LSSD scan chain) using the method of FIG. 3. The second exemplary defective LSSD scan chain 802 is similar to the LSSD scan chain 102 of FIG. 4. However, the LSSD scan chain 802 includes a DC defect, such as a stuck-@-1 defect. For example, the LSSD scan chain 802 may include a stuck-@-1 defect between the third SRL RSL3 and fourth SRL RSL4. The input of the fourth SRL RSL4 may be shorted to a high voltage (e.g., Vdd).

While using the method of FIG. 3 to isolate a defect in the LSSD scan chain 802, one or more latches included in the LSSD scan chain 802, and therefore, the LSSD scan chain 802, may be operated in a modified first test mode (e.g., modified flush test mode). For example, a Ripple Flush "0" may be performed. More specifically, one or more latches (e.g., latches whose first test modes are modified) included in the LSSD scan chain 802, and therefore, the LSSD scan chain 802 may be operated in the modified first test mode while a signal of a low logic state is applied to the input 804 of the defective LSSD scan chain 802. As described above, the values stored in and outputted by the first through third SRLs RSL1-RSL3 (e.g., a non-defective portion of the LSSD scan chain 802) are 1, 0 and 1, respectively. Due to the stuck-@-1 defect between the third SRL RSL3 and fourth SRL RSL4, a signal of a high logic state (e.g., 1) is inputted to the fourth SRL RSL4 regardless of the signal outputted by the third SRL RSL3. Therefore, the fourth through seventh SRLs RSL4-RSL7 included in the remaining non-defective section of the defective LSSD scan chain 802 may store and output (e.g., via output 810) values of 0, 1, 0 and 1, respectively. In this manner, the defective LSSD scan chain 802 may be initialized.

One or more latches included in the LSSD scan chain 802 may be operated in a second test mode (e.g., scan mode) to unload and observe data from the defective LSSD scan chain 802. For example, the values unloaded from the defective LSSD scan chain 802 after a Ripple Flush "0" may be 1, 0, 1, 0, 0, 0 and 0. The unloaded values do not accurately reflect the values stored in the latches during initialization. Such unloaded values may be used to isolate a defect in the LSSD scan chain 802.

Figure 9:
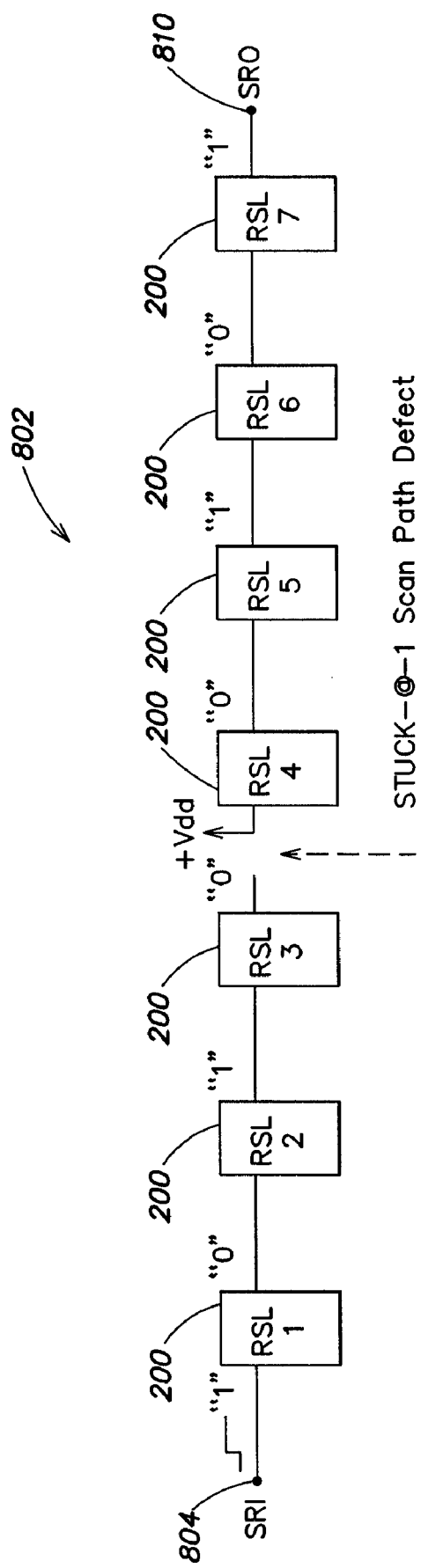
FIG. 9 illustrates second exemplary values stored in the second exemplary defective LSSD scan chain using the method of FIG. 3.

Similarly, FIG. 9 illustrates second exemplary values stored in the second defective LSSD scan chain 802 using the method of FIG. 3. While using the method of FIG. 3 to isolate a defect in the LSSD scan chain 802, one or more latches included in the LSSD scan chain 802 (e.g., latches whose first test modes are modified), and therefore the LSSD scan chain 802, may be operated in a modified first test mode (e.g., modified flush test mode). For example, a Ripple Flush "1" may be performed. For the reasons described above, the values stored in the first through third SRLs RSL1-RSL3 after the Ripple Flush "1" are 0, 1 and 0, respectively; and the values stored in the fourth through seventh SRLs RSL4-RSL7 after the Ripple Flush "1" are 0, 1, 0 and 1, respectively. In this manner, the defective LSSD scan chain 802 may be initialized.

As described above, one or more latches included in the LSSD scan chain 802 may be operated in a second test mode (e.g., scan mode) to unload and observe data from the LSSD scan chain 802. For example, by operating the defective LSSD scan chain 802 in the scan mode, the values 1, 0, 1, 0, 0, 0 and 0 may be unloaded from the LSSD scan chain 802. In contrast, as described with reference to FIG. 5, the values unloaded from a similar scan chain 102 (e.g., non-defective version of the defective LSSD scan chain 802) after a Ripple Flush "1" are 0, 1, 0, 1, 0, 1 and 0. By comparing the values unloaded from the defective LSSD scan chain 802 after a Ripple Flush "0" (e.g., 1, 0, 1, 0, 0, 0 and 0) and a Ripple Flush "1" (e.g., 1, 0, 1, 0, 0, 0 and 0), and comparing them to corresponding values from a "good machine" (e.g., a non-defective LSSD scan chain) for a Ripple Flush "0" (e.g., 1, 0, 1, 0, 1, 0 and 1) and a Ripple Flush "1" (e.g., 0, 1, 0, 1, 0, 1 and 0), a designer may isolate a defect, (e.g., the defect closest to the LSSD scan chain 802 output) in the defective LSSD scan chain 802.

Figure 10:
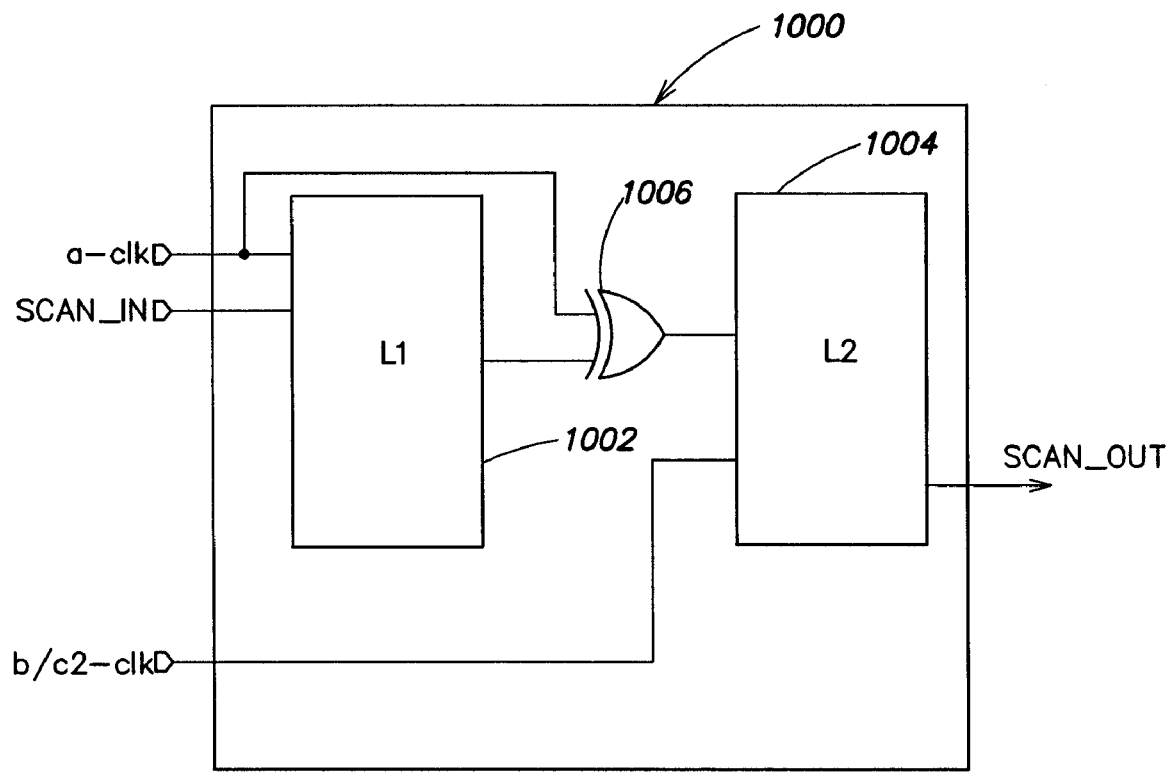
FIG. 10 is a block diagram of a second exemplary latch circuit which may be included in a LSSD scan chain in accordance with an embodiment of the present invention.

FIG. 10 is a block diagram of a second exemplary latch circuit 1000 which may be included in a LSSD scan chain in accordance with an embodiment of the present invention. The second exemplary latch circuit 1000 may include and be similar to a conventional master/slave latch. However, in contrast to the conventional master/slave latch, the second exemplary latch circuit 1000 may include an L1 latch 1002 coupled to an L2 latch 1004 via a logic device, such as an exclusive-OR (XOR) gate 1006. More specifically an output of the L1 latch 1002 may be coupled to an input of the XOR gate 1006. A clock signal, such as a clock signal (e.g., a-clk) used for capturing data (e.g., data received from the scan in input of the L1 latch 1002) in the L1 latch 1002, may be coupled to an input of the XOR gate 1006. The output of the XOR gate 1006 may be coupled to an input of the L2 latch 1004. When a-clk is asserted (e.g., is of a high logic state), the XOR gate 1006 serves as an inverter. More specifically, when a-clk is asserted, the XOR gate 1006 may receive as input the output of the L1 latch 1002, and output a complementary value to the L2 latch 1004 as input.

Because the output of the L2 latch 1004 may be the output of the second exemplary latch circuit 1000, the complement of the value outputted by the L1 latch 1002 may be outputted by the second exemplary latch circuit 1000.

Figure 11:
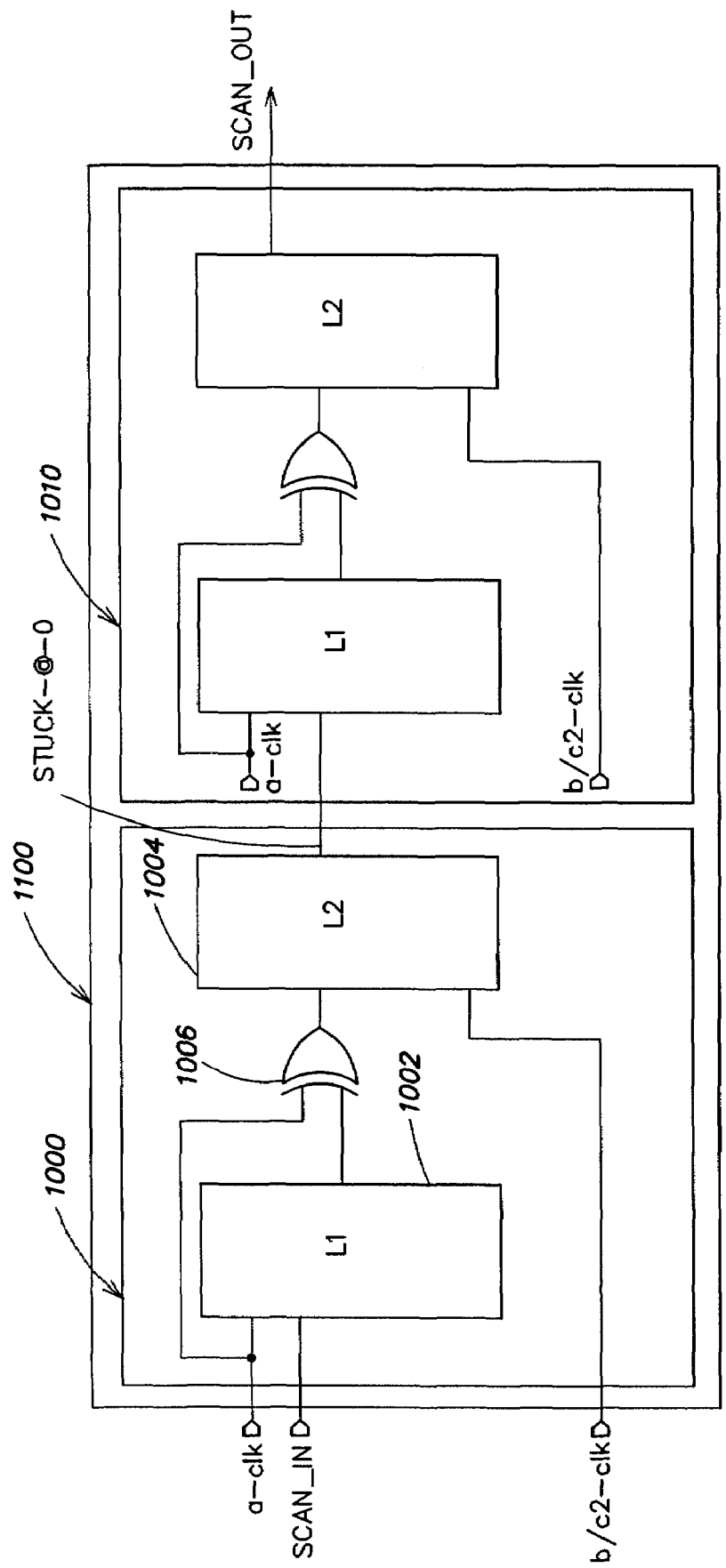
FIG. 11 is a block diagram of a first exemplary LSSD scan chain including one or more second exemplary latch circuits in accordance with an embodiment of the present invention.

The output of the L1 latch 1002 may serve as the functional output the second exemplary latch circuit 1000. Alternatively, the output of the L2 latch 1004 may serve as the functional output of the second exemplary latch circuit 1000. Typically, the L2 latch output is used as a functional output, but both L1 & L2 latch outputs could also be used as functional outputs. FIG. 11 is a block diagram of a first exemplary scan chain (e.g., LSSD scan chain 1100) including one or more second exemplary latch circuits 1000. For example, the first exemplary LSSD scan chain 1100 may include a first second exemplary latch circuit 1000 coupled to a second, second exemplary latch circuit 1010. More specifically, the output of the first second exemplary latch circuit 1000 serves as the scan input of the second, second exemplary latch circuit 1010. The first exemplary LSSD scan chain 1100 may include a defect, such as a stuck-@-0 defect, after an L2 latch of a second exemplary latch circuit included in the LSSD scan chain. For example, the first exemplary LSSD scan chain 1100 may include a stuck-@-0 defect on the output of the L2 latch 1004 included in the first second exemplary latch circuit 1000. Using the method described above, a defect, such as a stuck-@-0 defect, may be isolated to a latch (e.g., a second exemplary latch circuit 1000, 1010) included in the first exemplary LSSD scan chain 1100. Because the details of the method 300 were described above, they are not described again herein.

While operating one or more latches included in a LSSD scan chain (e.g., latches whose first test modes are modified) in a modified first test mode (e.g., modified flush test mode) in accordance with the method 300, a corresponding clocking scheme may be used. More specifically, while operating one or more latches included in a LSSD scan chain in the modified first test mode, a clock signal which is inputted by a logic device (e.g., XOR gate) included in the LSSD scan chain, may be disasserted after other clock signals. For example, to diagnose and test and/or isolate a defect in the LSSD scan chain 1100, while operating the latches (e.g., second exemplary latch circuits 1000, 1010) in a modified flush test mode, b/c2-clk may be disasserted before a-clk. Thereafter, while operating one or more latches included in the LSSD scan chain 1100 in a second test mode (e.g., scan mode) in accordance with the method 300, an appropriate clocking scheme may be used. More specifically, a clocking scheme may be used such that data stored in the LSSD scan chain 1100 (while operating one or more latches included in the LSSD scan chain 1100 in the first test mode) may be unloaded and/or observed while operating one or more latches in the LSSD scan chain 1100 in the second test mode. For example, non-overlapping pulses for a-clk and b/c2-clk may be used.

Other defects, such as a stuck-@-1 defect, after an L2 latch 1004 of a second exemplary latch circuit 1000 included in a LSSD scan chain 1100 may be isolated in a similar manner.

Figure 12:
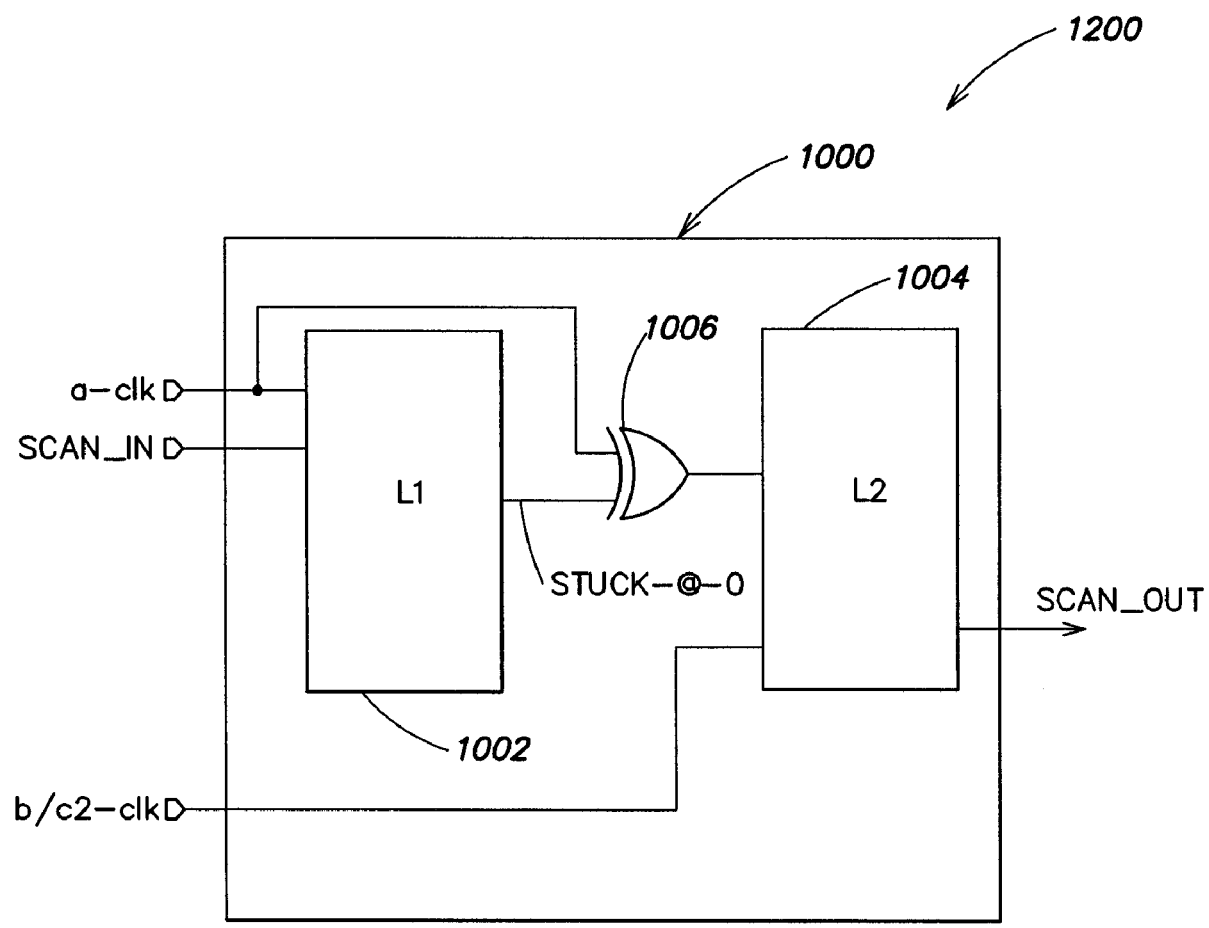
FIG. 12 is a block diagram of a second exemplary scan chain including one or more second exemplary latch circuits in accordance with an embodiment of the present invention.

FIG. 12 is a block diagram of a second exemplary scan chain (e.g., LSSD scan chain 1200) including one or more second exemplary latch circuits 1000 (only one shown). Similar to the LSSD scan chain 1100 of FIG. 11, the second exemplary LSSD scan chain 1200 may include a plurality (only one shown) of catenated second exemplary latch circuits 1000. The second exemplary LSSD scan chain 1200 may include a stuck-@-0 defect on the output of an L1 latch 1002 of a second exemplary latch circuit 1000 (only one shown) included in the LSSD scan chain 1200. As stated, using the method 300, a defect, such as a stuck-@-0 defect, may be isolated to a latch (e.g., a second exemplary latch circuit 1000) included in the LSSD scan chain 1200. Because the details of the method 300 were described above, they are not described again herein. Similar to the method described with reference to FIG. 11, while operating one or more latches included in a LSSD scan chain (e.g., latches whose first test modes are modified) in a modified test mode (e.g., modified flush test mode) in accordance with the method 300, a corresponding clocking scheme may be used. For example, to diagnose and test and/or isolate a defect in the LSSD scan chain 1200, while operating the latches (e.g., second exemplary latch circuits 1000) in a modified flush test mode, b/c2-clk may be disasserted before a-clk.

While operating one or more latches included in the LSSD scan chain 1200 in a second test mode (e.g., scan mode) in accordance with the method 300, an appropriate clocking scheme may be used. More specifically, a clocking scheme may be used such that data stored in the LSSD scan chain 1200 (while operating one or more latches included in the LSSD scan chain 1200 in the first test mode) may be unloaded and/or observed while operating one or more latches in the LSSD scan chain 1200 in the second test mode. For example, non-overlapping pulses for a-clk and b/c2-clk may be used.

Other defects, such as a stuck-@-1 defect, after an L1 latch 1002 of the second exemplary latch circuit 1000 included in the LSSD scan chain 1200 may be isolated in a similar manner. Through the use of one or more second exemplary latch circuits 1000 and the method 300, a defect may be isolated to a second exemplary latch circuit 1000 included in a LSSD scan chain 1200. Further, a user may observe the output of the LSSD scan chain between a-clk and b-clk on each scan cycle to further isolate the defect to either the L1 or L2 latch and/or associated circuitry of the second exemplary latch circuit 1000. Similarly, in a preferred embodiment, through the use of one or more catenated first exemplary latch circuits 200 and the method 300, a defect may be isolated to a first exemplary latch circuit 200 included in a LSSD scan chain 102, 602, 802. The XOR gates included in such a LSSD scan chain are in the scan paths of the first exemplary latch circuits and do not introduce delays to the functional path of the first exemplary latch circuits in the LSSD scan chains.

Figure 13:
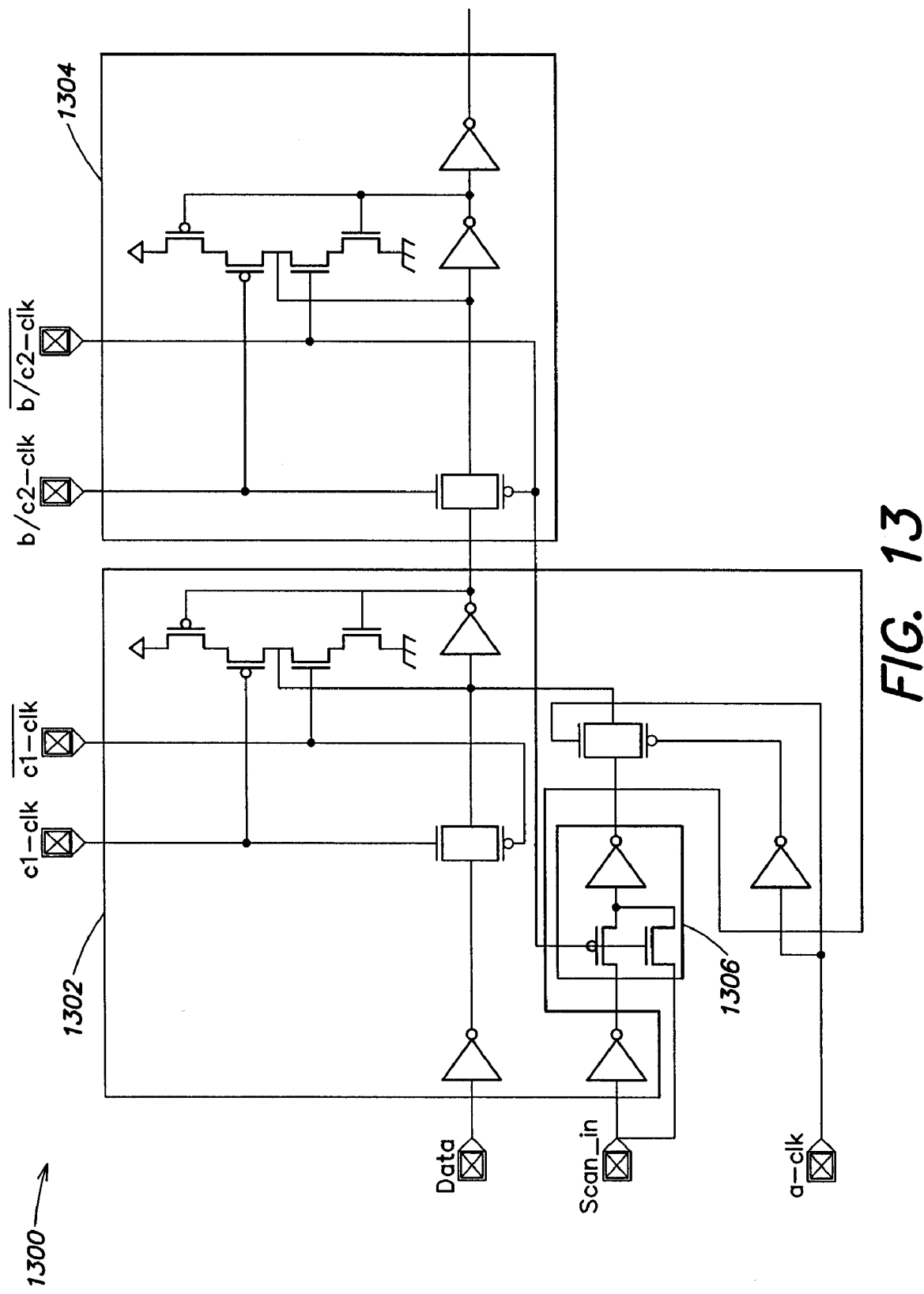
FIG. 13 is an exemplary embodiment of the first latch circuit of FIG. 2 in accordance with an embodiment of the present invention.

FIG. 13 is an exemplary embodiment of the first latch circuit 200 of FIG. 2 (referred to by reference numeral 1300 in FIG. 13) in accordance with an embodiment of the present invention. With reference to FIG. 13, the first latch circuit 1300 includes an L1 latch 1302, which may receive one or more versions of c1-clk (e.g., not c1-clk) as input, coupled to an L2 latch 1304. The first latch circuit 1300 includes an XOR gate 1306 coupled to the L1 latch 1302. The XOR gate 1306 is coupled to a scan_in port of the L1 latch 1302 and receives a version of b/c2-clk (e.g., not b/c2-clk) as input. The first latch circuit 1300 may function as described above with reference to FIG. 2.

The foregoing description discloses only exemplary embodiments of the invention. Modifications of the above disclosed apparatus and methods which fall within the scope of the invention will be readily apparent to those of ordinary skill in the art. For instance, although in one or more of the above embodiments, a structural scan design, such as LSSD is implemented, in other embodiments, other scan configurations such as General Scan Design (GSD) may be implemented. Further, although in the above embodiments, the exemplary latch circuits may be similar to master/slave SRL configuration, in other embodiments, the exemplary latches circuits may be similar to other latch configurations. Further, although in the above embodiments, the present method is performed on a LSSD scan chain, in other embodiments, the present method may be performed on multiple LSSD scan chains included in a LSSD circuit design simultaneously.

Although in one or more of the above embodiments, every latch included in a LSSD scan chain is a modified LSSD SRL, in other embodiments, one or more latches included in a LSSD scan chain may be a modified LSSD SRL in accordance with the present apparatus and methods. The one or more modified LSSD SRLs may be coupled to and/or integrated in a macro included in the LSSD scan chain or independent of the macro. Further, although in one or more of the above embodiments, an exemplary latch circuit and a corresponding clocking scheme are used to perform the present methods, in other embodiments, other exemplary latch circuit configurations and corresponding clocking schemes and clock polarities may be used to perform the present methods. Although in one or more embodiments, the modifications to the exemplary latch circuit (e.g., SRL) may be integrated in the SRL, in other embodiments, the modification may be external to the SRL. Further, although in one or more embodiments, the present apparatus and methods may be used to isolate DC defects, such as stuck-@-0 and stuck-@-1 defects, in other embodiments, the same and/or other defects in a LSSD scan chain may be isolated. For example AC defects, such as slow-to-rise, slow-to-fall, cross-coupling and noise disturbs, may be isolated in a LSSD scan chain. Further, the present methods and apparatus may be further enhanced and extended to diagnose similar DC and AC defects encountered in built-in self-test (BIST) structures which incorporate On-Product Clock Generation (OPCG) support, for example.

The present methods and apparatus do not require additional wiring (e.g., because a clock signal may be used for activating a logic device included in a latch circuit). The present methods and apparatus have a minimal impact on system critical paths, because the functional mode data path (e.g., system data path) may not be altered. Further, the impact on chip real-estate is small. Existing circuit designs may be re-spun to replace standard scannable latches with the apparatus (e.g., latch circuits 200, 1000) of the present invention.

Once a defect has been isolated using the present methods and apparatus Physical Failure Analysis (PFA) may be performed. PFA is known to one of skill in the art and is not described herein.

The present methods and apparatus are applicable to manufacturing test and diagnosis of scan chain defects. Such defects may be isolated to a failing latch. The present methods and apparatus may be performed during the test process of most scan based designs to isolate (e.g., pinpoint) systematic and/or random faults or defects. The present methods and apparatus may be automated on a test system. Further, the present methods and apparatus may be consistent with a flush delay test and compatible with a flush delay measurement.

Accordingly, while the present invention has been disclosed in connection with exemplary embodiments thereof, it should be understood that other embodiments may fall within the spirit and scope of the invention, as defined by the following claims.

The invention claimed is:

1. A method of isolating a defect in a scan chain comprising:
    modifying a first test mode of one or more of a plurality of latches included in the scan chain;
    operating the one or more latches whose first test modes are modified in the modified first test mode; and
    operating one or more of the plurality of latches included in the scan chain in a second test mode wherein adjacent portions of a non-defective section of the scan chain store complementary signals.

2. The method of claim 1 wherein the adjacent portions of a non-defective section of the scan chain store complementary signals when the one or more latches whose first test modes are modified are operated in the modified first test mode, wherein a portion includes at least one of one or more latches, one or more macros, and one or more partitions of a macro.

3. The method of claim 1 wherein operating the one or more latches whose first test modes are modified in the modified first test mode includes operating the one or more latches whose first test modes are modified in a modified flush test mode.

4. The method of claim 1 wherein operating one or more latches whose first test modes are modified in the modified first test mode includes initializing the value stored in the one or more latches whose first test modes are modified such that adjacent portions in a non-defective section of the scan chain store complementary signals, wherein a portion includes at least one of one or more latches, one or more macros, and one or more partitions of a macro.

5. The method of claim 1 wherein operating one or more of the plurality of latches included in the scan chain in the second test mode includes operating one or more of the plurality of latches included in the scan chain in a scan mode.

6. The method of claim 1 wherein operating one or more of the plurality of latches included in the scan chain in the second test mode includes unloading data from the scan chain.

7. The method of claim 1 wherein the scan chain is a level sensitive scan design (LSSD) scan chain.

8. A method of isolating a defect in a scan chain comprising:
modifying a first test mode of one or more of a plurality of latches included in the scan chain;
while inputting a first value to the scan chain, operating the one or more latches whose first test modes are modified in the modified first test mode to store a first set of data in the scan chain;
operating one or more of the plurality of latches included in the scan chain in a second test mode to output the first set of data;
while inputting a second value to the scan chain, operating the one or more latches whose first test modes are modified in the modified first test mode to store a second set of data in the scan chain;
operating one or more of the plurality of latches included in the scan chain in the second test mode to output the second set of data; and
employing the first set of data and the second set of data to isolate a defect in the scan chain.

9. The method of claim 8 wherein the scan chain is a level sensitive scan design (LSSD) scan chain.

10. A method of testing and diagnosing a scan chain comprising:
altering the function of a scan chain flush test mode of one or more of a plurality of latches included in the scan chain wherein altering the function of the scan chain flush test mode includes altering the function of the scan chain flush test mode such that an alternating set of complementing states are propagated through the scan chain; and
employing the flush test mode to test and diagnose the scan chain.

11. The method of claim 10 further comprising employing a scan mode to test and diagnose the scan chain.

12. The method of claim 10 wherein altering the function of the scan chain flush test mode includes altering the scan chain path input to one or more latches included in the scan chain such that the one or more latches write the scan input when the flush test mode is employed.

13. The method of claim 10 wherein the scan chain is a level sensitive scan design (LSSD) scan chain.

14. An integrated circuit (IC) for isolating a defect in a scan chain comprising:
a plurality of latches included in the scan chain; and
one or more logic devices coupled to the plurality of latches included in the scan chain;
wherein the IC is configured to:
modify a first test mode of one or more of the plurality of latches included in the scan chain;
operate the one or more latches whose first test modes are modified in the modified first test mode; and
operate one or more of the plurality of latches included in the scan chain in a second test mode wherein adjacent portions of a non-defective section of the scan chain store complementary signals.

15. The IC of claim 14 wherein the adjacent portions of a non-defective section of the scan chain store complementary signals when the one or more latches whose first test modes are modified are operated in the modified first test mode, wherein a portion includes at least one of one or more latches, one or more macros, and one or more partitions of a macro.

16. The IC of claim 14 wherein the IC is further configured to operate the one or more latches whose first test modes are modified in a modified flush test mode.

17. The IC of claim 14 wherein the IC is further configured to initialize the value stored in the one or more latches whose first test modes are modified such that adjacent portions in a non-defective section of the scan chain store complementary signals, wherein a portion includes at least one of one or more latches, one or more macros, and one or more partitions of a macro.

18. The IC of claim 14 wherein the IC is further configured to operate one or more latches of the plurality of latches included in the scan chain in a scan mode.

19. The IC of claim 14 wherein the IC is further configured to unload data from the scan chain.

20. The IC of claim 14 wherein at least one of the one or more logic devices is coupled to a scan input of one or more of the plurality of latches included in the scan chain.

21. The IC of claim 20 wherein at least one of the plurality of latches includes an L1 latch coupled to an L2 latch; and
wherein at least one of the one or more logic devices is coupled to an output of one or more of the L1 latches.

22. The IC of claim 14 wherein the scan chain is a level sensitive scan design (LSSD) scan chain.

23. An integrated circuit (IC) for isolating a defect in a scan chain comprising:
a plurality of latches included in the scan chain; and
one or more logic devices coupled to the plurality of latches included in the scan chain;
wherein the IC is configured to:
modify a first test mode of one or more of a plurality of latches included in the scan chain;
while inputting a first value to the scan chain, operate the one or more latches whose first test modes are modified in the modified first test mode to store a first set of data in the scan chain;
operate one or more of the plurality of latches included in the scan chain in a second test mode to output the first set of data;
while inputting a second value to the scan chain, operate the one or more latches whose first test modes are modified in the modified first test mode chain to store a second set of data in the scan chain;

operate one or more of the plurality of latches included in the scan chain in the second test mode to output the second set of data; and employ the first set of data and the second set of data to isolate a defect in the scan chain.

24. The IC of claim 23 wherein the scan chain is a level sensitive scan design (LSSD) scan chain.

25. An integrated circuit (IC) for testing and diagnosing a scan chain comprising:

a plurality of latches catenated into the scan chain; and
one or more logic devices coupled to the scan chain;
wherein the IC is configured to:
alter the function of the scan chain flush test mode such that an alternating set of complementing states are propagated through the scan chain; and
employ the flush test mode to test and diagnose the scan chain.

26. The IC of claim 25 wherein the IC is further configured to employ a scan mode to test and diagnose the scan chain.

27. The IC of claim 25 wherein the IC is further configured to alter the function of the scan chain flush test mode using the one or more logic devices such that an alternating set of complementing states are propagated through the scan chain.

28. The IC of claim 25 wherein the IC is further configured to alter the scan chain path input to one or more latches such that the one or more latches write the scan input when the flush test mode is employed.

29. The IC of claim 25 wherein the IC is further configured to alter the scan chain path input to one or more latches using one or more logic devices such that the one or more latches write the scan input when the flush test mode is employed.

30. The IC of claim 25 wherein the scan chain is a level sensitive scan design (LSSD) scan chain.

* * * * *